(12) United States Patent
Philippi

(10) Patent No.: US 10,792,865 B2
(45) Date of Patent: Oct. 6, 2020

(54) DEVICE AND METHOD FOR CALIBRATING A DEVICE FOR GENERATIVELY MANUFACTURING A THREE-DIMENSIONAL OBJECT

(71) Applicant: EOS GmbH Electro Optical Systems, Krailling (DE)

(72) Inventor: Jochen Philippi, Gräfelfing (DE)

(73) Assignee: EOS GmbH Electro Optical Systems, Krailling (DE)

( * ) Notice: Subject to any disclaimer, the term of this patent is extended or adjusted under 35 U.S.C. 154(b) by 225 days.

(21) Appl. No.: 16/061,009

(22) PCT Filed: Dec. 20, 2016

(86) PCT No.: PCT/EP2016/081884
§ 371 (c)(1),
(2) Date: Jun. 11, 2018

(87) PCT Pub. No.: WO2017/108762
PCT Pub. Date: Jun. 29, 2017

(65) Prior Publication Data
US 2018/0361728 A1    Dec. 20, 2018

(30) Foreign Application Priority Data
Dec. 23, 2015    (DE) .................... 10 2015 226 722

(51) Int. Cl.
*B29C 64/393*    (2017.01)
*B33Y 50/02*    (2015.01)
(Continued)

(52) U.S. Cl.
CPC .......... *B29C 64/393* (2017.08); *B29C 64/153* (2017.08); *B33Y 10/00* (2014.12);
(Continued)

(58) Field of Classification Search
CPC ......... B33Y 50/02; B33Y 10/00; B33Y 30/00; B29C 64/153; B29C 64/393; G05B 19/401; G06F 17/50; G06F 30/00
(Continued)

(56) References Cited

U.S. PATENT DOCUMENTS 5,059,021 A    10/1991  Spence et al.
5,133,987 A     7/1992  Spence et al.
(Continued)

FOREIGN PATENT DOCUMENTS

CN    1976800    6/2007
CN    100509360    7/2009
(Continued)

OTHER PUBLICATIONS

International Search Report for Application No. PCT/EP2016/081884 dated Apr. 3, 2017, 3 pages.

*Primary Examiner* — Chun Cao
(74) *Attorney, Agent, or Firm* — Seyfarth Shaw LLP

(57) ABSTRACT

A calibration ledge serves for calibrating a manufacturing device for manufacturing a three-dimensional object by a layer-by-layer solidification of a building material at the points corresponding to the respective cross-section of the object by selectively irradiating layers of the building material with a radiation in a working plane. The calibration ledge has an elongated shape and includes an aperture ledge extending in its longitudinal direction and comprising several aperture openings arranged in a row in the longitudinal direction of the calibration ledge which are more permeable for the radiation of the irradiation device than the region of the aperture ledge surrounding the aperture openings.

15 Claims, 5 Drawing Sheets

(51) Int. Cl.
*B29C 64/153* (2017.01)
*G06F 30/00* (2020.01)
*B33Y 10/00* (2015.01)
*B33Y 30/00* (2015.01)
*G05B 19/401* (2006.01)

(52) U.S. Cl.
CPC .............. *B33Y 30/00* (2014.12); *B33Y 50/02* (2014.12); *G05B 19/401* (2013.01); *G06F 30/00* (2020.01)

(58) Field of Classification Search
USPC ........................................................ 700/119
See application file for complete search history.

(56) References Cited

U.S. PATENT DOCUMENTS

| | | | | |
|---|---|---|---|---|
| 5,832,415 | A * | 11/1998 | Wilkening | B23K 26/382 |
| | | | | 702/86 |
| 6,483,596 | B1 | 11/2002 | Philippi et al. | |
| 6,501,061 | B1 * | 12/2002 | Kitai | B23K 26/04 |
| | | | | 250/205 |
| 8,040,530 | B2 * | 10/2011 | Cooper | B33Y 50/02 |
| | | | | 356/616 |
| 8,237,788 | B2 * | 8/2012 | Cooper | B29C 64/268 |
| | | | | 348/86 |
| 10,336,008 | B2 * | 7/2019 | Perret | B22F 3/1055 |
| 2007/0196561 | A1 | 8/2007 | Philippi et al. | |
| 2007/0247514 | A1 * | 10/2007 | Waidman | B23K 26/705 |
| | | | | 347/236 |
| 2010/0264302 | A1 | 10/2010 | Philippi | |
| 2014/0027421 | A1 | 1/2014 | Notheis | |
| 2014/0348692 | A1 | 11/2014 | Bessac et al. | |
| 2016/0082668 | A1 | 3/2016 | Perret et al. | |

FOREIGN PATENT DOCUMENTS

| | | |
|---|---|---|
| CN | 104010749 | 8/2014 |
| DE | 19918613 | 11/2000 |
| DE | 102009016585 | 10/2010 |
| DE | 102013208651 | 11/2014 |
| WO | 1999010136 | 3/1999 |
| WO | 2010115588 | 10/2010 |
| WO | 2012130666 | 10/2012 |

* cited by examiner a)

b) c)

DEVICE AND METHOD FOR CALIBRATING A DEVICE FOR GENERATIVELY MANUFACTURING A THREE-DIMENSIONAL OBJECT

TECHNICAL FIELD OF THE INVENTION

The present invention relates to a device and a method for calibrating a device for generatively manufacturing a three-dimensional object, in particular, by a layer-by-layer application and selective solidification of a building material by means of radiation.

BACKGROUND OF THE INVENTION

Devices of this type are, for instance, used in Rapid Prototyping, Rapid Tooling, or Additive Manufacturing. An example of such a method is known as the "selective laser sintering or melting". In the course of this, a thin layer of a building material in powder form is repeatedly applied, and the building material in each layer is selectively solidified by selectively irradiating it using a laser beam.

In order that the points at which the laser beam hits the powder layer (actual positions) coincide with the desired points (target positions), the device needs to be calibrated in advance.

DE 199 18 613 A1 describes a method of calibrating an apparatus for generatively manufacturing a three-dimensional object wherein a calibration plate having reference marks and a medium sensitive to the radiation of the apparatus is arranged at a known point in the apparatus and generates a test pattern by irradiating the medium by the radiation of the apparatus. This test pattern is digitised, and correction data for controlling the irradiation device of the apparatus are calculated by comparing the test pattern with the reference marks.

DE 20 2009 016 585 A1 describes a method of calibrating a device for generatively manufacturing a three-dimensional object wherein an image converter plate is arranged in a working plane of the device and is scanned by a laser beam. The image converter plate is made of a material which emits detectable light when irradiated by the laser beam. A hole mask is arranged above the image converter plate in which hole mask holes are formed at predetermined points. These holes are preferably distributed in the form of a matrix over the whole hole mask. When the laser beam hits one of the holes, the image converter plate generates detectable light, which is captured by a detector mounted below the image converter plate. When capturing the light, the coordinates to which the irradiation device emits the laser beam are compared with the known coordinates of the holes, and correction data are derived therefrom.

DE 10 2013 208 651 A1 describes a method of calibrating a device for generatively manufacturing a three-dimensional object wherein two irradiation devices are used. In the overlap area of the two irradiation devices, a test pattern is generated by each irradiation device in a light-sensitive medium or an applied powder layer. The two test patterns are compared with each other or with a reference pattern, and the two irradiation devices are calibrated such that the discrepancies lie below a predetermined threshold.

SUMMARY OF THE INVENTION

It is the object of the present invention to provide an alternative, preferably improved device or, respectively, an alternative, preferably improved method for calibrating a device for generatively manufacturing a three-dimensional object, in particular, by a layer-by-layer application and selective solidification of a building material by means of radiation.

The object is achieved by a calibration ledge according to claim 1, a calibration device according to claim 7, a manufacturing device according to claim 10, a calibration method according to claim 12, and a manufacturing method according to claim 15. Further developments of the invention are respectively provided in the dependent claims. In the course of this, the methods may also be further developed by the features of the devices provided below or, respectively, set forth in the dependent claims or vice versa, or, respectively, the features of the methods and/or of the devices may also be respectively used among themselves for a further development.

The calibration ledge according to the invention serves for calibrating a manufacturing device for manufacturing a three-dimensional object within a build area by a layer-by-layer solidification of a building material at the points corresponding to the respective cross-section of the object by selectively irradiating layers of the building material with a radiation in a working plane. The manufacturing device comprises an irradiation device capable of selectively directing a radiation suitable for solidifying the building material, preferably laser radiation, radiation of a gas laser being further preferred, specifically of a gas laser in the lower to medium wavelength range, specifically preferably of a gas laser, to different points of the working plane within the build area. The calibration ledge has an elongated shape and comprises an aperture ledge extending in its longitudinal direction and comprising several aperture openings arranged in a row in the longitudinal direction of the calibration ledge which are more permeable for the radiation of the irradiation device than the region of the aperture ledge surrounding the aperture openings. The calibration ledge further comprises a sensor ledge extending in its longitudinal direction, having a substantially parallel arrangement with respect to the aperture ledge, and comprising at least one surface sensor capable of detecting the radiation of the irradiation device. The calibration ledge is mountable in the manufacturing device such that the radiation of the irradiation device can hit the at least one surface sensor through the aperture openings, wherein the calibration ledge is preferably mountable in the manufacturing device such that the aperture ledge lies in the working plane of the manufacturing device. With such a calibration ledge it is, for instance, possible to calibrate the irradiation device of the manufacturing device such that the emitted radiation hits the build area precisely at the desired target position.

Preferably, the aperture openings are at least 10 times, preferably 100 times, further preferred at least 1000 times more permeable for the radiation of the irradiation device than the region of the aperture ledge surrounding the aperture openings. Thereby, for instance, a sufficient contrast in an output signal of the surface sensor can be achieved which makes it possible to distinguish when the radiation passes through the aperture opening and when not.

Preferably, the aperture openings are widened in the direction towards the sensor ledge and/or have a diameter in the range from a tenth to the tenfold of the focal diameter of the radiation of the irradiation device. Thereby, for instance, the manufacturing of the aperture opening can be simplified and/or its diameter can be flexibly adapted to the needs.

Preferably, the sensor ledge comprises several surface sensors arranged in a row in the longitudinal direction of the calibration ledge. This can, for instance, be more economical than using a single surface sensor extending over the total length.

Preferably, the at least one surface sensor or at least one of said several surface sensors, preferably each one of said several surface sensors, has an extension in the longitudinal direction of the calibration ledge which is greater than the distance between two neighbouring aperture openings. Thereby, the number of used surface sensors can be reduced.

Preferably, the at least one surface sensor or at least one of said several surface sensors is a spatially resolving sensor. Thereby, for instance, the position of a maximum of the intensity of the incident radiation can be directly determined.

The calibration device according to the invention serves for calibrating a manufacturing device for manufacturing a three-dimensional object by a layer-by-layer solidification of a building material at the points corresponding to the respective cross-section of the object by selectively irradiating layers of the building material with a radiation in a working plane of the manufacturing device. The calibration device comprises a calibration ledge of the type described above and at least one evaluation unit suitable for evaluating an output signal of the at least one surface sensor. Preferably, the at least one evaluation unit is suitable for determining amplitudes and/or lengths of single pulses contained in the output signal, setting up a spatial distribution of the determined amplitudes and/or lengths, and evaluating this spatial distribution. By such a calibration device, for instance, the desired data can be obtained from an output signal of the surface sensor.

Preferably, the calibration ledge comprises several surface sensors, and at least one evaluation unit is connected to more than one surface sensor of the calibration ledge. It is further preferred that the surface sensors connected to the same evaluation unit are electrically connected in series. Thereby, for instance, the number of the required evaluation units can be reduced.

Preferably, the calibration ledge comprises several surface sensors, and the calibration device contains an individual evaluation unit for each of said several surface sensors. Thereby, for instance, several aperture openings assigned to different surface sensors can be measured simultaneously.

The manufacturing device according to the invention serves for manufacturing a three-dimensional object by a layer-by-layer solidification of a building material within a build area at the points corresponding to the respective cross-section of the object by selectively irradiating layers of the building material with a radiation in a working plane. The manufacturing device comprises an irradiation device capable of selectively directing a radiation suitable for solidifying the building material, preferably laser radiation, radiation of a gas laser being further preferred, to different points of the working plane within the build area, and a calibration ledge and/or a calibration device of the type described above. The calibration ledge is arranged in the manufacturing device such that the radiation of the irradiation device can hit the at least one surface sensor through the aperture openings, and preferably such that the aperture ledge lies in the working plane of the manufacturing device. Preferably, the calibration ledge is movably arranged in the manufacturing device, in a further preferred manner arranged being movable transversely to its longitudinal direction and, in a still further preferred manner, arranged being movable perpendicularly to its longitudinal direction. With such a manufacturing device it is, for instance, possible to calibrate the irradiation device of the manufacturing device such that the emitted radiation hits the build area precisely at the desired target position.

Preferably, the manufacturing device according to the invention further comprises a recoater movable across the build area in a movement direction for applying a layer of the building material to the build area, and the calibration ledge is mounted at the recoater and being movable together with it such that its longitudinal direction extends transversely, preferably perpendicularly to the movement direction of the recoater. Thereby, for instance, a drive already existing in the device, namely the drive of the recoater, can be used for moving the calibration ledge across the build area.

The calibration method according to the invention serves for calibrating a manufacturing device for manufacturing a three-dimensional object within a build area by a layer-by-layer solidification of a building material at the points corresponding to the respective cross-section of the object by selectively irradiating layers of the building material with a radiation in a working plane. The manufacturing device comprises an irradiation device capable of selectively directing a radiation suitable for solidifying the building material, preferably laser radiation, radiation of a gas laser being further preferred, to different points of the working plane within the build area. The method comprises the following steps: mounting a calibration ledge of the type described above inside the manufacturing device such that the radiation of the irradiation device can hit the at least one surface sensor through the aperture openings, and preferably such that the aperture ledge (42) lies in the working plane of the manufacturing device, scanning at least one aperture opening of the calibration ledge by the radiation of the irradiation device, capturing an output signal of the at least one surface sensor, determining the position of the centre of the at least one aperture opening in an irradiation coordinate system from the captured output signal, comparing the position of the centre of the at least one aperture opening in the irradiation coordinate system with a known position of the centre of the aperture opening in a machine coordinate system permanently fixed to the build area, and calculating correction data for the irradiation device from the result of the comparison. Preferably, two or more aperture openings of the calibration ledge are scanned by the radiation of the irradiation device and their positions in the irradiation coordinate system are determined and/or the calibration ledge is moved transversely to its longitudinal direction, in a further preferred manner perpendicularly to its longitudinal direction across the build area, and in at least one further position of the calibration ledge at least one aperture opening is scanned by the radiation of the irradiation device and its position in the irradiation coordinate system is determined. With such a calibration method it is, for instance, possible to calibrate the irradiation device of the manufacturing device such that the emitted radiation hits the build area precisely at the desired target position.

Preferably, the step of scanning at least one aperture opening includes a first step of the scanning of the aperture opening by the radiation of the irradiation device in the form of vectors running parallel to each other in a first direction or the direction opposite to that and having a distance from each other, and a second step of the scanning of the aperture opening by the radiation of the irradiation device in the form of vectors running parallel to each other in a second direction or the direction opposite to that and having a distance from each other, wherein the second direction is transverse, preferably perpendicular to the first direction. Preferably, further, the step of capturing an output signal of the at least one surface sensor includes, for each of the two scanning steps, determining amplitudes and/or lengths of single pulses corresponding to the vectors. Preferably, further, the step of determining the centre of the aperture opening in the irradiation coordinate system includes, for each of the two scanning steps, setting up a spatial distribution of the determined amplitudes and/or lengths and evaluating this spatial distribution. Thereby, for instance, the calibration can be made less sensitive to time delays and/or other time factors.

Preferably, the calibration method additionally includes, after the calibration of the irradiation device, the measurement of a focal diameter of a radiation emitted by the irradiation device comprising the steps of: scanning an aperture opening of the calibration ledge by the radiation of the irradiation device in the form of a scanning vector going through the aperture centre at a predetermined scanning speed, measuring a duration of a pulse of the output signal of the surface sensor, calculating the focal diameter of the radiation from the measured duration and the predetermined scanning speed. Thereby, for instance, an inspection of the beam profile of the radiation emitted by the irradiation device in the observation plane can be carried out.

The manufacturing method according to the invention serves for manufacturing a three-dimensional object within a build area and comprises the steps of: applying a layer of a building material using a recoater by moving the recoater across the build area, solidifying the layer of the building material at the points corresponding to the respective cross-section of the object by selectively irradiating it with a radiation suitable for solidifying the building material, preferably laser radiation, radiation of a gas laser being further preferred, within the build area, and repeating the steps of applying and solidifying until the three-dimensional object is completed. In the course of this, a calibration method of the type described above is carried out at least once before the manufacturing method or during the manufacturing method. Thereby, for instance, an object can be manufactured with higher accuracy than without calibrating.

DETAILED DESCRIPTION OF THE EMBODIMENTS

Figure 1:
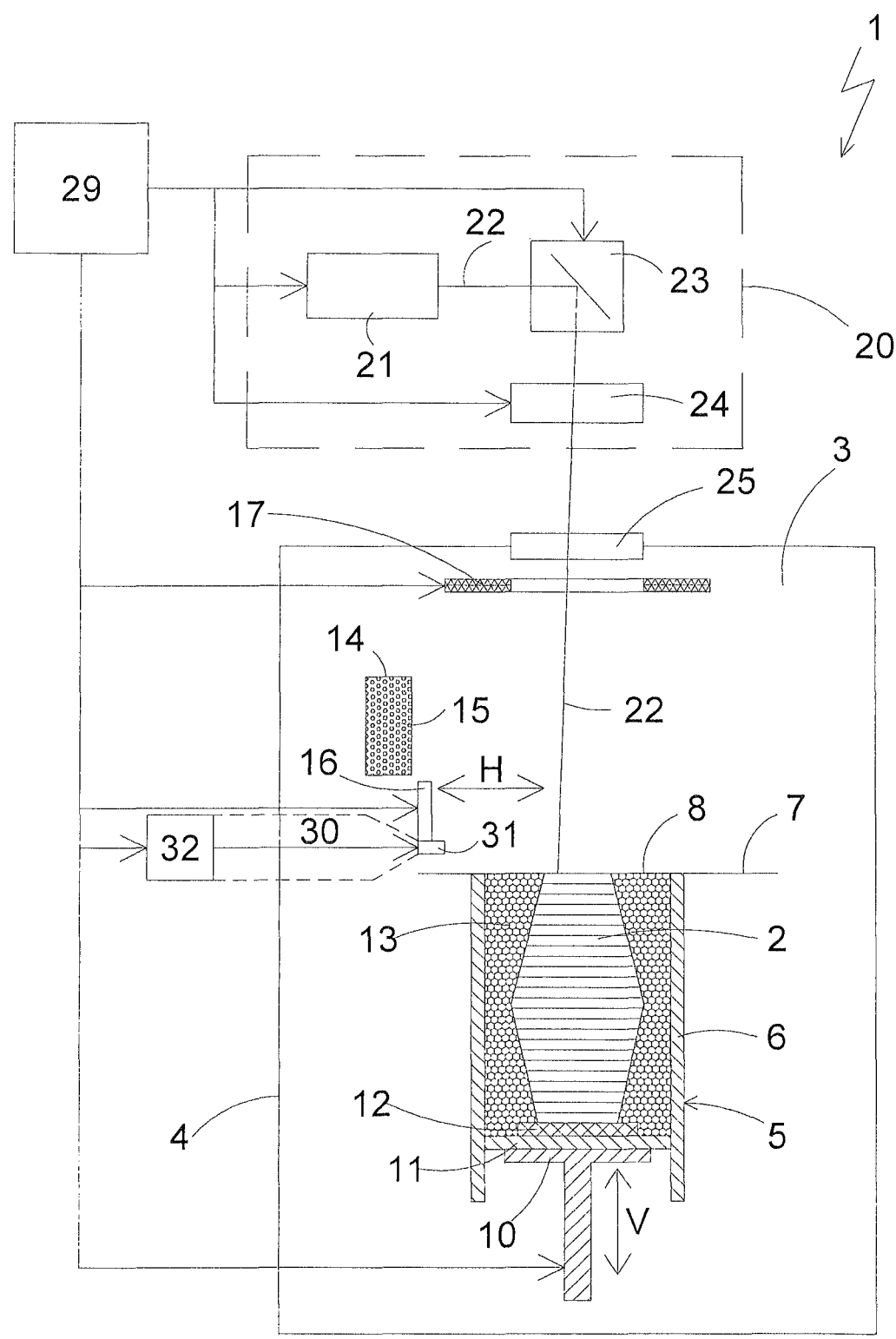
FIG. 1 is a schematic, partially cross-sectional view of a device for a layer-by-layer generative manufacturing of a three-dimensional object according to an embodiment of the present invention.

In the following, a device for a layer-by-layer generative manufacturing of a three-dimensional object according to an embodiment of the present invention is described referring to FIG. 1. The device shown in FIG. 1 is a laser sintering or laser melting device 1. For building up an object 2, it contains a process chamber 3 having a chamber wall 4.

In the process chamber 3, a container 5 open to the top and having a wall 6 is arranged. By the upper opening of the container 5, a working plane 7 is defined, wherein the region of the working plane 7 lying within the opening which can be used for building up the object 2 is denoted as build area 8.

In the container 5, a support 10 movable in a vertical direction V is arranged at which a base plate 11 is mounted which closes the container 5 in a downward direction and thereby forms its bottom. The base plate 11 may be a plate formed separately from the support 10, which is attached to the support 10, or it may be integrally formed with the support 10. Depending on a powder used and a process, a building platform 12 on which the object 2 is built up may further be mounted on the base plate 11. However, the object 2 may also be built up on the base plate 11 itself, which then serves as a building platform. In FIG. 1, the object 2 to be built in the container 5 on the building platform 12 is shown below the working plane 7 in an intermediate state having several solidified layers surrounded by building material 13 remaining non-solidified.

The laser sintering device 1 further contains a storage container 14 for a building material 15 in powder form which can be solidified by electromagnetic radiation and a recoater 16 movable in a horizontal direction H for applying the building material 15 to the build area 8.

The laser sintering device 1 further contains an irradiation device 20 having a laser 21, preferably a gas laser, such as a $CO_2$ laser, generating a laser beam 22 deflected via a deflecting device 23 and focused by a focusing device 24 via a coupling window 25, which is mounted at the upper side of the process chamber 3 in its wall 4, onto the working plane 7.

The laser sintering device 1 further contains a control unit 29 via which the individual component parts of the device 1 are controlled in a coordinated manner for performing the building process. The control unit may contain a CPU whose operation is controlled by a computer program (software). The computer program may be stored separately from the device on a storage medium, from which it can be loaded into the device, in particular, into the control unit.

During operation, first, the support 10 is lowered for the application of a powder layer by a height corresponding to the desired layer thickness. By moving the recoater 16 across the working plane 7, a layer of the building material 15 in powder form is then applied. The application is performed at least over the total cross-section of the object 2 to be manufactured, preferably across the whole build area 8, i.e. the region of the working plane 7 which can be lowered by a vertical movement of the support. Subsequently, the cross-section of the object 2 to be manufactured is scanned by the laser beam 22, so that the building material 15 in powder form is solidified at the points corresponding to the cross-section of the object 2 to be manufactured. These steps are repeated as long as until the object 2 is completed and can be removed from the process chamber 3.

For calibrating the irradiation device 20, the laser sintering device 1 contains a calibration device 30 comprising a calibration ledge 31 and an evaluation unit 32. The calibration ledge 31 is arranged in the process chamber 3 and is movably mounted at the recoater 16 being movable together with the same. The evaluation unit 32 is preferably arranged outside the process chamber 3 and is connected to the calibration ledge 31 in terms of signalling. The evaluation unit 32 can also be integrated in the control unit 29 instead of being formed as a separate unit, or it can be integrated in the calibration ledge 31.

Figure 2:
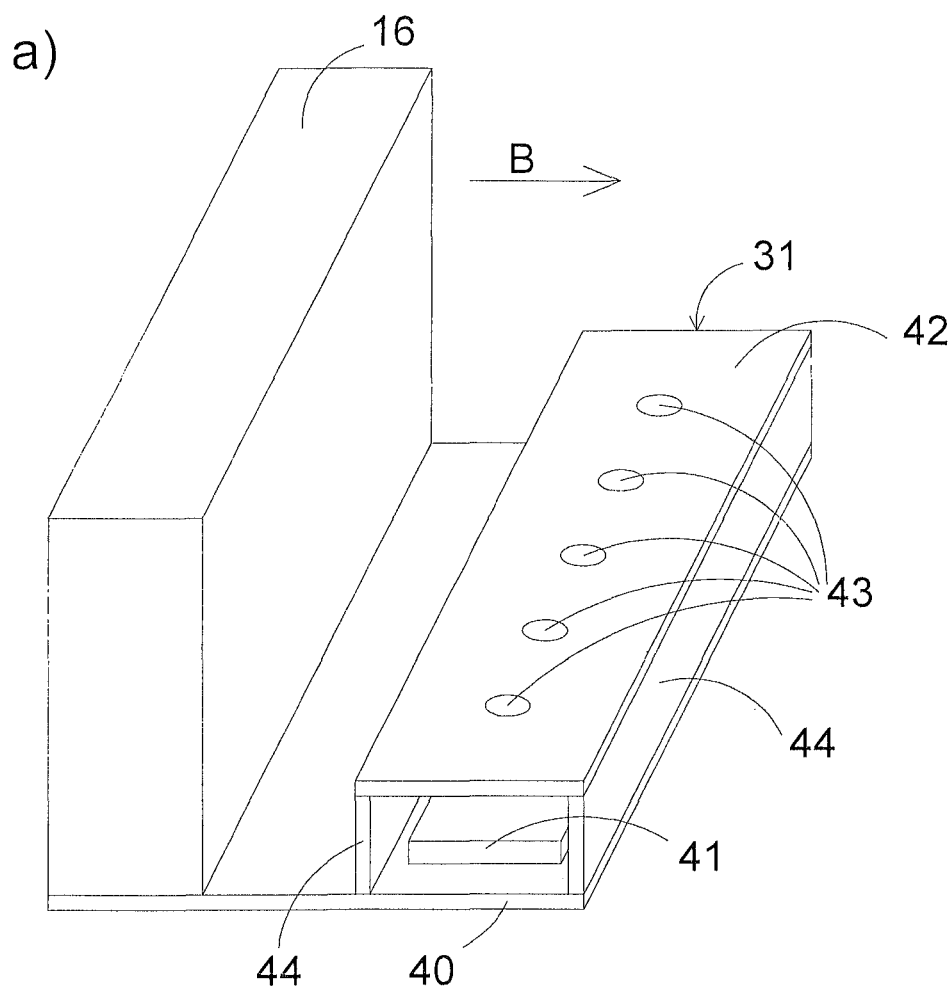
FIG. 2a is a schematic perspective view of a calibration ledge mounted at a recoater in the device of FIG. 1.
FIG. 2b is a schematic cross-sectional view of the calibration ledge.
FIG. 2c is a schematic top view of the calibration ledge.
Figure 2:
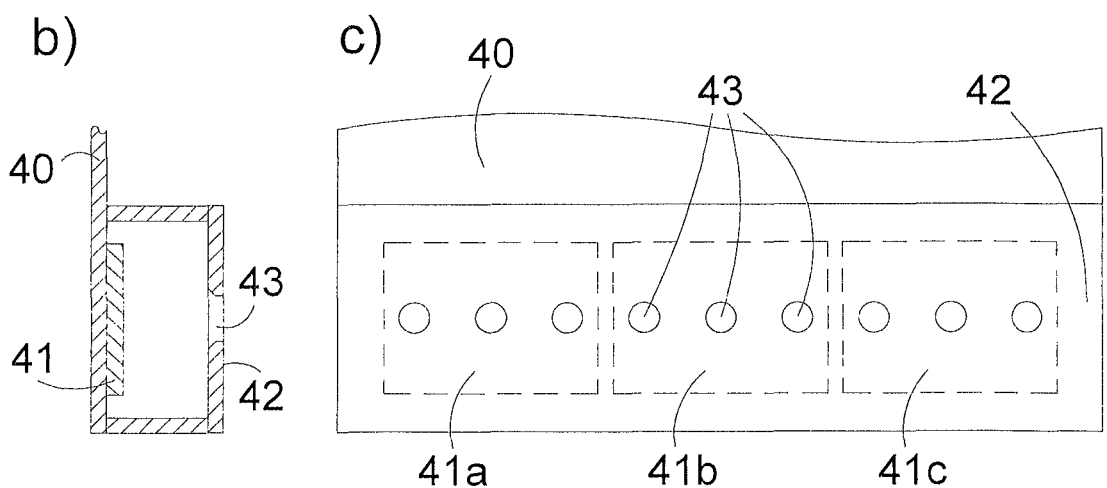

FIG. 2a is a schematic, not drawn to scale, perspective view of the recoater 16 with the calibration ledge 31 mounted at it.

Representatively for any recoater shape applicable in laser sintering machines, the recoater 16 is only schematically shown in the figure as a cuboid extending in a longitudinal direction and being movable in a movement direction B transverse to its longitudinal direction, preferably perpendicular to its longitudinal direction. The calibration ledge 31 also having an elongated shape is mounted at the recoater 16. In the course of this, elongated means that the dimension in a first direction is significantly greater than in a second direction transverse to the first direction, preferably at least twice as great, in a further preferred manner at least five times as great, and in a still further preferred manner at least ten times as great. The mounting is preferably carried out such that the longitudinal direction of the calibration ledge 31 extends parallel to the longitudinal direction of the recoater 16. The calibration ledge 31 as a whole or at least parts of it are preferably detachable from the recoater 16.

The calibration ledge 31 includes a sensor ledge 40 extending in the longitudinal direction of the calibration ledge 31 and via which the calibration ledge 31 is mounted at the recoater 16. On the sensor ledge 40, a surface sensor 41 capable of detecting the laser radiation used in the device 1 and also extending in the longitudinal direction of the calibration ledge 31 is mounted.

Further, parallel to the sensor ledge 40 on the side of the surface sensor 41, the calibration ledge 31 contains an aperture ledge 42 also extending in the longitudinal direction of the calibration ledge 31 and being made of a material impervious to light, for instance, a metal ledge. In the aperture ledge 42, several aperture openings 43 are arranged in a row in the longitudinal direction of the calibration ledge 31. The aperture openings 43 are formed as through-holes in the aperture ledge 42. The arrangement in a row is not limited to the arrangement on a straight line shown in FIG. 2a. The aperture openings 43 can also be arranged, for instance, in the form of a sinuous line, a stepped line, a zigzag line etc. In the course of this, the surface sensor 41 is at least so large that the light passing through all aperture openings 43 at normal incidence of light on the aperture ledge 43 hits it.

The space between the sensor ledge 40 and the aperture ledge 42 is closed by side walls 44. While, for the sake of clarity, side walls 44 are shown in FIG. 2a only at the long sides, they can also be arranged at the narrow sides. The side walls 44 can also be formed integrally with the aperture ledge 42, which then exhibits a U-profile, or with the sensor ledge 40.

The calibration ledge 31 is mounted at the recoater 16 such that the aperture ledge 42 lies above the sensor ledge 40, so that the radiation of the irradiation device 20 can hit the surface sensor 41 on a direct path, i.e. without reflection and/or scattering, through the aperture openings 43.

FIG. 2b is a schematic cross-sectional view through the calibration ledge 31 (rotated by 90° with respect to FIG. 2a). As one can see from this cross-sectional view, the through-holes forming the aperture openings 43 do not have a constant cross-section, but are widened in the direction towards the sensor ledge 40. In the present embodiment, a hole first passes at a constant cross-section in the direction towards the sensor ledge and is then linearly widened, i.e. the hole is bevelled on the side of the sensor ledge. This bevel facilitates the drilling of a fine through-hole even in a thick aperture ledge. However, the widening can also take place across the total length of the hole. It also need not be linear, but can, for instance, also have a stepped or curved shape.

FIG. 2c is a schematic top view of the calibration ledge 31. In this example, instead of an end-to-end surface sensor 41, three surface sensors 41a, 41b, 41c (as hidden elements indicated by a dashed line) are provided separately from each other and arranged in a row in the longitudinal direction of the calibration ledge 31. In the course of this, each one of the three surface sensors is longer in the longitudinal direction of the calibration ledge 31 than a distance between neighbouring aperture openings 43. In an extreme case, an individual surface sensor can also be provided for each one of the aperture openings 43.

It is of subordinate importance for the calibration how many surface sensors are provided. In practice, one will rather use several surface sensors since a large surface sensor extending over the total length of the calibration ledge is not economical to produce.

As surface sensor, all sensor types can be used which are capable of detecting the radiation used for solidifying the building material. In the case of a $CO_2$ laser, preferably, a thermoelectric atom layer sensor is used. The sensor outputs an output signal corresponding to the measured intensity of the laser beam to the evaluation device. This signal can, for instance, be proportional to the measured intensity, or follow a logarithmic curve, or depend on the intensity via some other function.

Figure 3:
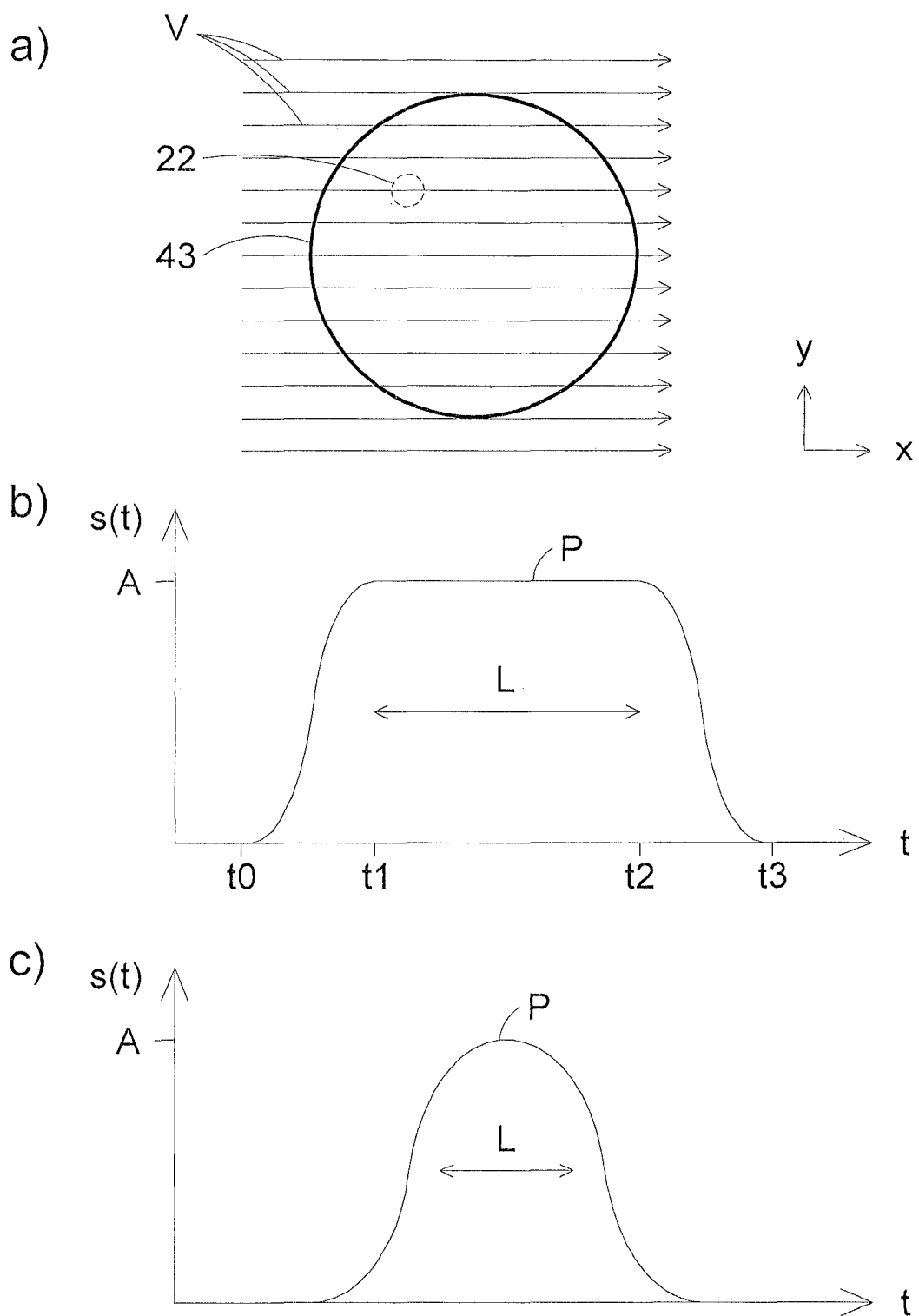
FIG. 3a is a schematic top view for explaining the scanning of an aperture opening by the laser beam in the form of separate vectors.
FIGS. 3b and 3c are diagrams showing an output signal of a sensor of the calibration ledge for an individual vector.

For calibrating the device, the recoater 16 is moved such that the aperture ledge 42 lies in the working plane 7 (i.e. in the focal plane of the laser beam 22) and the aperture openings 43 are at predetermined positions of the build area 8. Subsequently, at least one, preferably several of the aperture openings 43 are scanned by the laser beam. This scanning is explained in the following with reference to FIG. 3.

As schematically shown in FIG. 3a, which shows a top view of an aperture opening 43 arranged in the working plane 7 and its surrounding area, the laser beam 22 having a specific focal diameter and shown in the figure by a dashed circle moves across the aperture opening 43 in an x-direction lying in the working plane. Even though the laser beam 22 is shown in the figure as a circle having a fixed diameter, typically, the light intensity gradually decreases in the outward direction, for instance, following a Gaussian distribution. In this case, for instance, the full width at half maximum of the intensity distribution of the laser beam profile can be defined as a focal diameter. Subsequently, the laser beam 22 is shifted by a predetermined distance in a y-direction perpendicular to the x-direction and also lying in the working plane, and moves again in the x-direction across the aperture opening 43. This is repeated several times. The scanning of the aperture opening 43 is, thus, performed in the form of several scanning vectors S (briefly referred to as vectors in the following) extending in the x-direction and having a distance from each other in the y-direction.

A well-established construction of the deflecting device 23 contains two galvanometer mirrors deflecting the laser beam 22 in two directions perpendicular to each other. In order to achieve the procedure described above, the one mirror remains fixed during the scanning of the aperture opening 43 by a vector S, while the other mirror is being rotated. Subsequently, the mirror held fixed previously is rotated by a predetermined amount and is subsequently held fixed again, while the other mirror is being rotated for scanning the next vector. As shown in FIG. 3a, the vectors can be scanned in the same direction or also alternately in opposite directions.

In the course of this, the scanning goes beyond the boundaries of the aperture opening 43, but only the sections of the vectors S lying within the aperture opening 43 are captured by the surface sensor 41 and subsequently evaluated.

FIG. 3b schematically shows a time behaviour of a measured light intensity when the laser beam 22 scans a vector S.

As soon as the laser beam 22 reaches the (left in FIG. 3a) edge of the aperture opening 43 at the time t0, an output signal s(t) of the surface sensor 41 corresponding to the measured intensity starts to rise. When the laser beam 22 fully falls through the aperture opening 43 at the time t1, the output signal s(t) reaches its maximum value and stays approximately constant until the laser beam 22 reaches the (right in FIG. 3a) edge of the aperture opening 43 at the time t2. Thereafter, the output signal s(t) decreases again until the laser beam 22 does not pass through the aperture opening 43 at all at the time t3 and the output signal s(t) becomes zero. That way, the scanning of the aperture opening 43 by the laser beam 22 generates a single pulse P, whose length L (duration) is determined by the scanning speed of the laser beam 22 and the chord length of the aperture opening 43 at the scanned position, and whose amplitude A is determined by the intensity of the laser beam 22 and the sensitivity of the surface sensor 41. The signal curve of the single pulse P is additionally influenced by the laser beam profile. In this context, single pulse means a pulse generated by scanning the aperture opening 43 by a laser beam 22 having a constant intensity in the output signal s(t) of the surface sensor 41, and not a pulse of a laser being, as the case may be, operated in pulse mode.

For all individual vectors S, a similar signal curve s(t) results, save that the amplitudes A and/or the lengths L of the single pulses P corresponding to the individual vectors S differ from each other. As regards the measurement technology, the amplitudes A of the single pulses P can be captured, for instance, via a maximum value measurement across the pulse duration and the lengths L of the single pulses P, for instance, by a time measurement between two time points at which the output signal s(t) exceeds a predetermined threshold, e.g. 5%, 50% (=full width at half maximum), or 95% of the maximum value, or by integrating of the signal value over the total duration of a pulse P. In the course of this, it is not a matter of the exact value of the determination of the length L, but of the relative differences between the lengths L of the single pulses P.

FIG. 3c schematically shows a time behaviour of a measured light intensity when the laser beam 22 scans a vector S and the diameter or, respectively, the scanned circle segment of the aperture opening 43 is approximately equal to the focal diameter of the laser beam 22. The signal curve s(t) generated in the course of this does not have a region having an approximately constant signal level, but a bell-shaped behaviour. Also in the course of this, regarding the measurement technology, an amplitude A and a length L, e.g. the full width at half maximum of the bell curve, can be determined.

When the diameter of the aperture opening 43 is significantly smaller than the focal diameter of the laser beam 22, a signal curve s(t) similar to that shown in FIG. 3b results again, though having a significantly smaller amplitude A since never the full laser beam, but always only a cutout filtered by the aperture opening 43 hits the surface sensor 41.

An example of an evaluation of the individual signal curves is shown in FIG. 4. In the course of this, FIG. 4a shows a perspective 3D view of the measured signal curves. The signal curves of each single pulse are plotted parallel to the time axis, which corresponds to the x-axis when scanning as shown in FIG. 3a. The signal curves of different single pulses are shifted with respect to each other along the positioning axis, which corresponds to the y-axis when scanning as shown in FIG. 3a, by a distance corresponding to the distance of the scanning vectors S from each other shown in FIG. 3a.

Figure 4A:
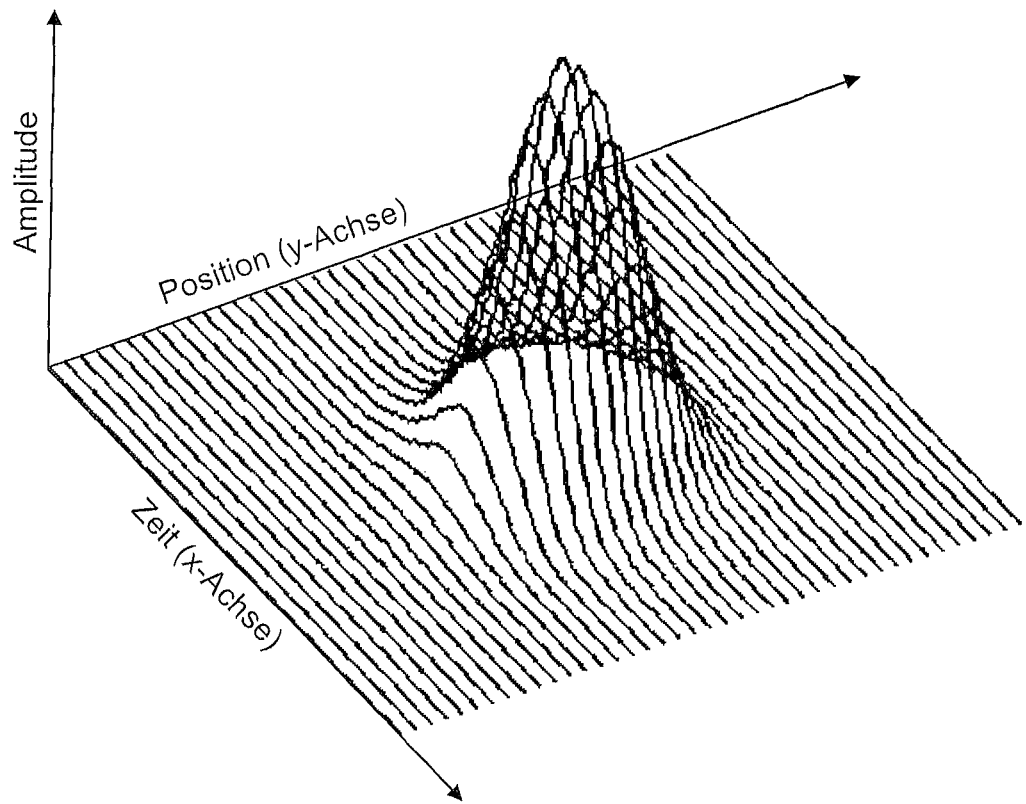
FIG. 4a is a diagram showing a perspective 3D view of the measured light intensities.
Figure 4B:
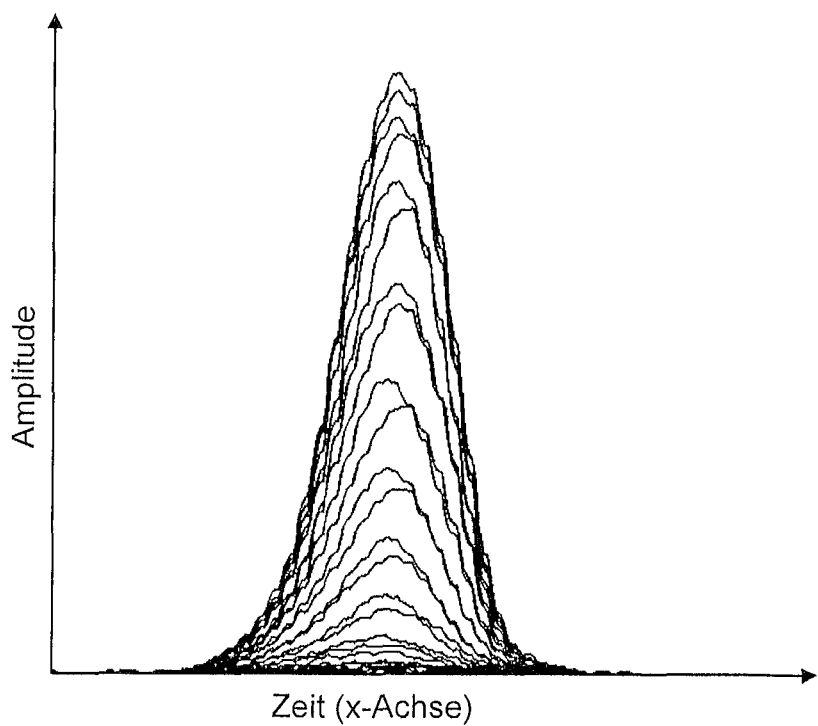
FIG. 4b is a diagram showing superimposed temporal behaviours of the measured light intensities.

FIG. 4b shows a projection of the 3D view onto the amplitude-time-plane. Each curve of this family of curves represents a temporal signal behaviour s(t) at a specific position in the Y-direction.

Figure 4C:
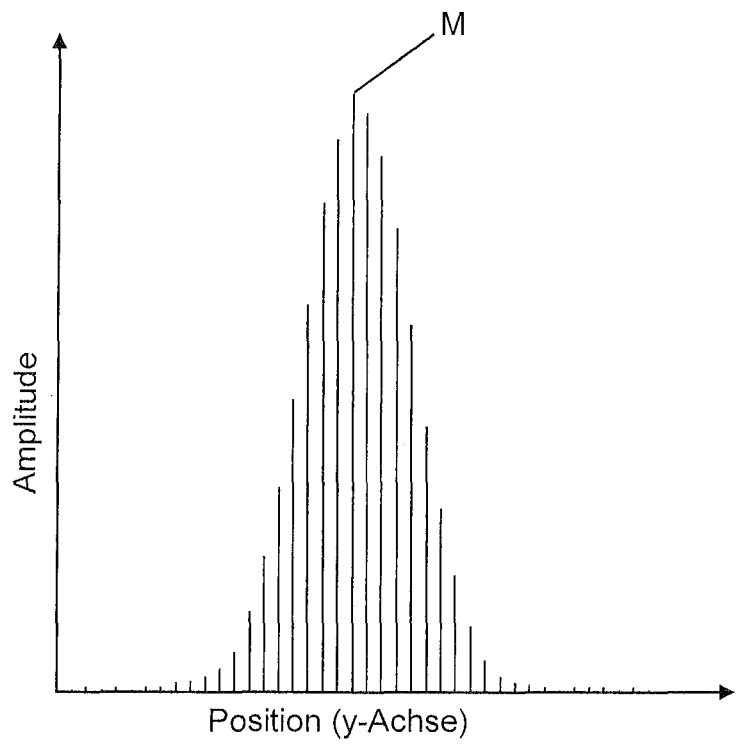
FIG. 4c is a diagram showing a spatial distribution of amplitudes of measured light intensity behaviours.

FIG. 4c shows a projection of the 3D view onto the amplitude-position-plane. Since the individual signal curves are arranged parallel to the time axis and, thus, perpendicularly to the positioning axis, a vertical line results in this view for each single pulse, whose height corresponds to the amplitude A of the pulse.

FIG. 4c thus shows a spatial distribution of the amplitudes A depending on the position of the individual vectors in the y-direction. Since the scanning vectors S are shifted with respect to each other by a constant amount in the y-direction, this spatial distribution shows an equidistant arrangement of the values of the individual amplitudes A on the y-axis.

Now, the maximum M is determined from this spatial distribution. To this end, most simply, the vector S having the greatest amplitude A can be selected, as shown in FIG. 4c. In particular in the case of a symmetrical distribution, i.e. when both next smaller vectors on both sides have the same length, it can be assumed that the vector having the maximum length is assigned to the y-coordinate corresponding to the centre of the aperture opening.

Figure 4D:
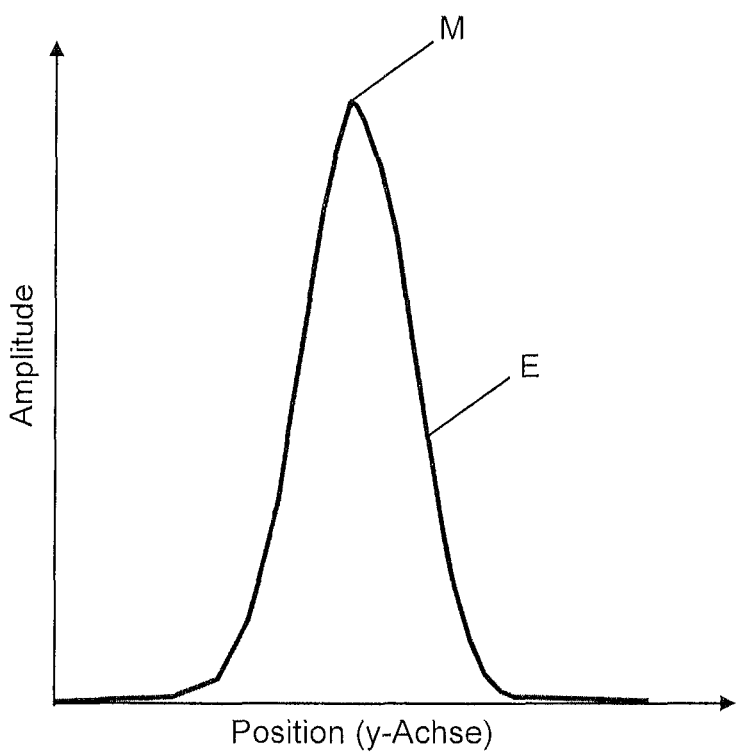
FIG. 4d is a diagram showing an envelope of the amplitudes shown in FIG. 4c.

However, the series of the determined amplitudes A can also be interpolated by means of a method known as such, for instance using splines, wherefrom an envelope E results, as it is shown in FIG. 4d. From the resulting envelope E, the maximum M and therefrom the y-coordinate of the centre of the aperture opening can be determined. However, also the flanks can be evaluated and the y-coordinate of the centre of the aperture opening can be determined therefrom, for instance, from the arithmetic mean of the two positions at which the envelope exhibits 50% (or another percentage) of its maximum. If, as in the example shown in FIG. 4c, the left neighbour of the pulse having the maximum amplitude has a greater amplitude than the right neighbour, the maximum M of the envelope E will lie between the pulse having the maximum amplitude and a left neighbour, as shown in FIG. 4d. Thus, by forming the envelope, the accuracy of the measuring procedure can be improved.

However, a spatial distribution, as it is shown in FIG. 4c, can also be generated from the lengths L of the single pulses P determined by measurement techniques. In the course of this, the heights of the individual vertical lines correspond not to the amplitudes A of the assigned pulses P, but to their lengths L. From this spatial distribution of the lengths L, the y-coordinate of the centre of the aperture opening is determined in the same manner as described above for the amplitudes A.

After the y-coordinate of the centre of the aperture opening has been determined in this manner, the x-coordinate of the centre of the aperture opening is determined in the same manner by scanning the aperture opening in the y-direction by individual vectors shifted with respect to each other in the x-direction.

Subsequently, a further aperture opening can be scanned and the x- and y-coordinates of its centre be determined in the same manner.

When all desired aperture openings have been measured, the recoater 16 moves in its movement direction B to a further predetermined position and stops there. Then, again, one or more aperture openings can be measured in the same manner. This is repeated as long as until all measurements desired for the calibration are performed. This can vary from measuring one single aperture opening at a specific position of the recoater up to measuring all aperture openings at several positions of the recoater.

The x- and y-coordinates of the centres of the aperture openings thus determined correspond to the irradiation coordinate system, i.e. to the position settings of the irradiation device, i.e., for instance, for a deflecting device having galvanometer mirrors, to the settings of the two galvanometer mirrors.

On the other hand, the x- and y-coordinates of the centres of the aperture openings in the machine coordinate system, i.e. a coordinate system permanently fixed to the build area, are known from the geometrical arrangement of the aperture openings on the aperture ledge and the predetermined positions into which the recoater moves.

From a comparison of the determined coordinates in the irradiation coordinate system with the known coordinates in the machine coordinate system, discrepancies can be detected and correction data for the irradiation device can be calculated therefrom.

In the described method, the y-coordinate of the centre of the aperture opening is determined by repeatedly scanning the aperture hole in the x-direction, the x-coordinate by repeatedly scanning the aperture hole in the y-direction. Thereby, it is possible to carry out the determination of position of the centre of the aperture opening independently of the timing of the vectors, a tracking error, or other delays as well as other time factors, whereby the accuracy of the measurement is increased.

The coordinates are, thus, not directly determined from the data of each vector itself (e.g. amplitude, length, or temporal state of the corresponding pulse), but from the spatial distribution of the amplitudes or, respectively, lengths of the single pulses perpendicularly to the scanning direction of the corresponding vectors. In other words, not the permanently changing state of the moved galvanometer mirror is evaluated, which generates the scanning vectors, but the static (steady) state of the stationary mirror during each scanning process, which is only moved for switching between the scanning vectors. Therefore, temporal delays etc. of the moving galvanometer mirror do not impair the accuracy of the measurement.

The time interval between the individual vectors is, in contrast, large enough for that the spatial coordinate (e.g. the y-coordinate when scanning in the x-direction) can be unambiguously assigned to a corresponding vector.

After the generation of the correction data for the irradiation device it is ensured that, when the irradiation device is actuated with a specific coordinate of the irradiation device, the laser beam is actually precisely directed to the corresponding point of the machine coordinate system. When merely one aperture opening is measured, only globally a misalignment in the x- and/or y-direction can be corrected. In the case of two aperture openings, additionally, a torsion and a scaling (map scale factor) can be corrected. The more aperture openings are measured, the better global and/or local distortions can then be corrected.

After the calibration of the irradiation device, the calibration ledge can also be used for measuring a focal diameter of the laser beam. To this end, an aperture opening is scanned by the laser beam at a predetermined scanning speed such that the scanning vector goes through the centre of the aperture opening. In the course of this, the output signal of the surface sensor has a characteristics similar to that shown in FIG. 3b. The duration of the corresponding pulse of the output signal is measured, for instance, at a threshold of 90 to 95% of the maximum level, and the focal diameter of the laser beam is calculated from the measured duration and the predetermined scanning speed. A theoretical model of the laser beam profile (e.g. Gaussian profile) is included in this calculation. By comparing the measured signal curve with the signal curve calculated according to the model of the laser beam for moving across the aperture at a fixed speed, the focal diameter of the laser beam can be determined.

By arranging several aperture openings in the aperture ledge and moving the calibration ledge across the build area, also a distribution of the focal diameter across the build area can be determined, if height adjustability of the recoater or, respectively, the calibration ledge is provided, also in several planes.

In the embodiment described above, the aperture openings are formed as through-holes in a material substantially impervious to the used radiation. However, alternatively to that, the aperture ledge can also be made of a material permeable for the radiation with a mask being formed thereon of a material impervious to the radiation in which the aperture openings are left open, for instance, of a glass substrate with a chrome mask. In this case, the mask should be at least 10 times, preferably at least 100 times, and in a further preferred manner at least 1000 times less permeable for the used radiation at normal incidence of the radiation than the carrier substrate.

The aperture openings also need not be larger than the focal diameter of the laser beam as in the embodiment described above, but they can also be smaller. For instance, with a focal diameter of 0.5 mm typical of a $CO_2$ laser, aperture openings of 0.4 mm can be used. Also in this case, a different length of the individual vectors results, and therefrom the possibility of determining the coordinate of the centre of the aperture opening via a distribution of the vector lengths. Preferably, the diameter of the aperture opening is in a range from a tenth to the tenfold of the focal diameter of the laser beam, which is, for instance, defined by the full width at half maximum of the intensity distribution of the laser beam profile.

Besides the described circular shape, the aperture openings can also have another shape, e.g. a rhombus shape, as long as it is ensured that the lengths of the pulses corresponding to the individual vectors change with a lateral shift.

When the used laser power is to high, so that there is a danger of damaging the aperture ledge, the laser can also be purposefully defocused for the calibration. A calibration outside the focal plane can also be performed in that the aperture ledge is brought not into the working plane, but correspondingly below or above it.

When using several surface sensors, all surface sensors can be connected to the same evaluation device, for instance, in that they are electrically connected in series. However, also several evaluation devices can be provided, wherein only a part of the surface sensors or even only one single surface sensor is connected to each evaluation device. When using several evaluation devices, also several calibrations can be performed simultaneously in a multiple head device which can emit several laser beams simultaneously to different points.

As surface sensors, also spatially resolving sensors can be used, which measure not only the intensity of the incident radiation, but also the position of the incidence or, respectively, an intensity distribution if a diameter of the laser beam extends over several measurement points (pixels) of the spatially resolving sensor.

Whereas the calibration ledge is mounted at the recoater and is moved together with it in the embodiment described above, the present invention is not limited to this. The calibration ledge can also be permanently built-in in the device (or be built-in when needed) or be movable separately from the recoater, preferably transversely, in a further preferred manner perpendicularly to its longitudinal direction.

The calibration ledge can also be used for calibrating multiple head systems where more than one laser beam is used simultaneously for solidifying the building material. The laser beams can scan the aperture openings successively. However, when the surface sensor is subdivided into several individual sensors, aperture openings assigned to different surface sensors can also be scanned simultaneously.

Even though the present invention has been described on the basis of a laser sintering or, respectively, laser melting device, it is not limited to the laser sintering or laser melting. It may be applied to arbitrary methods of manufacturing a three-dimensional object by a layer-by-layer application and selective solidification of a building material by means of radiation.

The irradiator may, for instance, comprise one or more gas or solid state lasers or any other type of lasers, such as e.g. laser diodes, in particular VCSEL (Vertical Cavity Surface Emitting Laser) or VECSEL (Vertical External Cavity Surface Emitting Laser), in particular, a line of these lasers. Generally, any device by means of which energy can be selectively applied to a layer of the building material as wave or particle radiation may be used as irradiator. Instead of a laser, for instance, another light source, an electron beam, or any other energy or, respectively, radiation source may be used which is suitable for solidifying the building material.

For manufacturing the object, various types of building materials may be used, in particular, powders such as metal powder, plastic powder, ceramic powder, sand, filled or mixed powders.

The invention claimed is:

1. A calibration device for calibrating a manufacturing device for manufacturing a three-dimensional object within a build area by a layer-by-layer solidification of a building material at points corresponding to a cross-section of the object by selectively irradiating layers of the building material with a radiation in a working plane, wherein the calibration device comprises:
a calibration ledge having an elongated shape and an aperture ledge extending in an aperture ledge longitudinal direction, the aperture ledge comprising a plurality of aperture openings arranged in a row in the aperture ledge longitudinal direction which are more permeable for the radiation of an irradiation device than a region of the aperture ledge surrounding the aperture openings,
the calibration ledge further comprising a sensor ledge extending in a sensor ledge longitudinal direction, arranged substantially parallel to the aperture ledge, and comprising at least one surface sensor capable of detecting the radiation of the irradiation device, and
the calibration ledge being mountable in the manufacturing device such that the radiation of the irradiation device can hit the at least one surface sensor through the aperture openings,
wherein the calibration device further comprises at least one evaluation unit that evaluates an output signal of the at least one surface sensor,
wherein the at least one evaluation unit determines for one aperture opening amplitudes and/or lengths of single pulses contained in the output signal, sets up a spatial distribution of the determined amplitudes and/or lengths, and evaluates the spatial distribution, wherein one of the single pulses is a pulse in the output signal of the surface sensor that is generated by scanning the aperture opening by the radiation.

2. The calibration device according to claim 1, wherein the aperture openings of the calibration ledge are at least 10 times more permeable for the radiation of the irradiation device than the region of the aperture ledge surrounding the aperture openings.

3. The calibration device according to claim 1, wherein the aperture openings of the calibration ledge are widened in a direction towards the sensor ledge and/or have a diameter in a range from a tenth to tenfold of a focal diameter of the radiation of the irradiation device.

4. The calibration device according to claim 1, wherein the sensor ledge comprises a plurality of surface sensors arranged in a row in a calibration ledge longitudinal direction of the calibration ledge.

5. The calibration device according to claim 4, wherein the at least one surface sensor or at least one of the plurality of surface sensors has an extension in the calibration ledge longitudinal direction which is greater than a distance between two neighbouring aperture openings.

6. The calibration device according to claim 1, wherein the at least one surface sensor or at least one of the plurality of surface sensors is a spatially resolving sensor.

7. The calibration device of claim 1, wherein the calibration ledge is mountable in the manufacturing device such that the aperture ledge lies in the working plane of the manufacturing device.

8. The calibration device according to claim 1, wherein the sensor ledge of the calibration ledge comprises a plurality of surface sensors arranged in a row in a calibration ledge longitudinal direction of the calibration ledge; and
at least one evaluation unit is connected to more than one of the surface sensors of the calibration ledge,
wherein the surface sensors connected to a same evaluation unit are electrically connected in series.

9. The calibration device according to claim 1, wherein the sensor ledge of the calibration ledge comprises a plurality of surface sensors arranged in a row in a calibration ledge longitudinal direction of the calibration ledge; and
the calibration device contains an individual evaluation unit for each of the several surface sensors.

10. A manufacturing device for manufacturing a three-dimensional object by a layer-by-layer solidification of a building material within a build area at points corresponding to a cross-section of the object by selectively irradiating layers of the building material with a radiation in a working plane, wherein the manufacturing device comprises:

an irradiation device capable of selectively directing a radiation suitable for solidifying the building material to different points of the working plane within the build area, and a calibration device according to claim 1, wherein, the calibration ledge is movably arranged in the manufacturing device.

11. The manufacturing device according to claim 10, further comprising a recoater movable across the build area in a movement direction for applying a layer of the building material to the build area, wherein the calibration ledge is mounted at the recoater and is movable together with the recoater such that a calibration ledge longitudinal direction of the calibration ledge extends transversely to the movement direction of the recoater.

12. A calibration method for calibrating a manufacturing device for manufacturing a three-dimensional object within a build area by a layer-by-layer solidification of a building material at points corresponding to a cross-section of the object by selectively irradiating layers of the building material with a radiation in a working plane, wherein the manufacturing device comprises an irradiation device capable of selectively directing a radiation suitable for solidifying the building material to different points of the working plane within the build area, wherein the method comprises the following steps:

providing a calibration ledge having an elongated shape, the calibration ledge comprising an aperture ledge extending in an aperture ledge longitudinal direction and comprising a plurality of aperture openings arranged in a row in a calibration ledge longitudinal direction of the calibration ledge which are more permeable for the radiation of the irradiation device than a region of the aperture ledge surrounding the aperture openings, and the calibration ledge further comprising a sensor ledge extending in a sensor ledge longitudinal direction, arranged substantially parallel to the aperture ledge, and comprising at least one surface sensor capable of detecting the radiation of the irradiation device, mounting the calibration ledge inside the manufacturing device such that the radiation of the irradiation device can hit the at least one surface sensor through the aperture openings, scanning at least one aperture opening of the calibration ledge by the radiation of the irradiation device in the form of vectors running parallel to each other, each vector generating a single pulse in an output signal of the at least one surface sensor, capturing the output signal of the at least one surface sensor, determining the position of a center of the at least one aperture opening in an irradiation coordinate system from the captured output signal, comparing the position of the center of the at least one aperture opening in the irradiation coordinate system with a known position of the center of the aperture opening in a machine coordinate system permanently fixed to the build area, and calculating correction data for the irradiation device from the result of the comparison, wherein two or more aperture openings of the calibration ledge are scanned by the radiation of the irradiation device and positions of the two or more aperture openings in the irradiation coordinate system are determined and/or wherein the calibration ledge is moved transversely to its longitudinal direction and in at least one further position of the calibration ledge at least one aperture opening is scanned by the radiation of the irradiation device and a position of the at least one aperture opening in the irradiation coordinate system is determined.

13. The calibration method according to claim 12, wherein the step of scanning at least one aperture opening includes a first step of the scanning of the aperture opening by the radiation of the irradiation device in the form of vectors running parallel to each other in a first direction or a second direction opposite that the first direction and having a distance from each other, and a second step of the scanning of the aperture opening by the radiation of the irradiation device in the form of vectors running parallel to each other in a third direction or a fourth direction opposite that the third direction and having a distance from each other, wherein the third direction is transverse to the first direction, the step of capturing an output signal of the at least one surface sensor includes, for each of the two scanning steps, determining amplitudes and/or lengths of single pulses corresponding to the vectors, and the step of determining the center of the aperture opening in the irradiation coordinate system includes, for each of the two scanning steps, setting up a spatial distribution of the determined amplitudes and/or lengths and evaluating the spatial distribution.

14. The calibration method according to claim 12, further comprising, after the calibration of the irradiation device, measuring a focal diameter of a radiation emitted by the irradiation device comprising the steps of:

scanning an aperture opening of the calibration ledge by the radiation of the irradiation device in the form of a scanning vector going through a center of the aperture, at a predetermined scanning speed, measuring a duration of a pulse of the output signal of the surface sensor, and calculating the focal diameter of the radiation from the measured duration and the predetermined scanning speed.

15. A manufacturing method for manufacturing a three-dimensional object within a build area, comprising the steps of:

applying a layer of a building material using a recoater by moving the recoater across the build area;

solidifying the layer of the building material at points corresponding to a cross-section of the object by selectively irradiating the cross-section with a radiation suitable for solidifying the building material within the build area; and repeating the steps of applying and solidifying until the three-dimensional object is completed, wherein a calibration method according to claim 12 is carried out at least once before the manufacturing method or during the manufacturing method.

* * * * *